(12) United States Patent
Badrak (10) Patent No.: US 9,097,076 B2
(45) Date of Patent: Aug. 4, 2015

(54) HARD SURFACING NON-METALLIC SLIP COMPONENTS FOR DOWNHOLE TOOLS

(71) Applicant: Robert P. Badrak, Sugar Land, TX (US)

(72) Inventor: Robert P. Badrak, Sugar Land, TX (US)

(73) Assignee: Weatherford Technology Holdings, LLC, Houston, TX (US)

( * ) Notice: Subject to any disclaimer, the term of this patent is extended or adjusted under 35 U.S.C. 154(b) by 347 days.

(21) Appl. No.: 13/762,199

(22) Filed: Feb. 7, 2013

(65) Prior Publication Data

US 2014/0216722 A1 Aug. 7, 2014

(51) Int. Cl.
| | |
|---|---|
| *E21B 17/10* | (2006.01) |
| *E21B 33/129* | (2006.01) |
| *C23C 14/46* | (2006.01) |
| *E21B 23/01* | (2006.01) |
| *C23C 14/00* | (2006.01) |
| *C23C 14/58* | (2006.01) |

(52) U.S. Cl.
CPC .................. *E21B 23/01* (2013.01); *C23C 14/00* (2013.01); *C23C 14/584* (2013.01); *E21B 17/1085* (2013.01); *E21B 33/129* (2013.01)

(58) Field of Classification Search
CPC ... E21B 17/1085; E21B 33/129; C23C 14/00; C23C 14/0031; C23C 14/0052; C23C 14/3442; C23C 14/34; C23C 14/46; C23C 14/48

See application file for complete search history.

(56) References Cited

U.S. PATENT DOCUMENTS

| | | | |
|---|---|---|---|
| 4,551,603 A | 11/1985 | Rocklin | |
| 5,224,540 A | 7/1993 | Streich et al. | |
| 5,897,966 A * | 4/1999 | Grossklaus et al. | ......... 428/652 |
| 6,417,477 B1 | 7/2002 | Brown et al. | |
| 6,426,476 B1 * | 7/2002 | Senor et al. | ................. 219/76.13 |

(Continued)

FOREIGN PATENT DOCUMENTS

EP 1212777 B1 5/2004

OTHER PUBLICATIONS

Dolinsek, S., et al., "ESD (Electrospark Deposition) for surfacing DMLS (Direct Metal Laser Sintering) tools," Achievements in Mechanical & Materials Engineering, Conference Proceedings of 12th Int'l Scientific Conference 2004, obtained from www.journalamme.org/papers_amme03/12217.pdf.

Johnson, R.N., et al., "Electro-Spark Deposited Coatings for Replacement of Chrome Plating," Armament Research, Development and Engineering Center, Jun. 2005.

(Continued)

*Primary Examiner* — Frederick L Lagman
(74) *Attorney, Agent, or Firm* — Blank Rome, LLP (57) ABSTRACT

A slip component for a downhole tool has a bearing surface that is hard surface treated. The slip component, which can be a slip or other component of a slip mechanism used on a packer, bridge plug, or other downhole tool, is composed of a non-metallic base material, such as plastic, composite, or ceramic. To hard surface treat the slip component, at least the bearing surface is positioned relative to an ion sputtering apparatus. An intermediate layer is first bonded onto the bearing surface by ion sputtering an intermediate material onto the non-metallic base material of the slip component. Then, the bearing surface of the slip component is positioned relative to an electrosparking apparatus, which has an electrode composed of a selected external material for depositing on the slip component. Using the electrosparking apparatus, an external layer is bonded at least on the bearing surface.

16 Claims, 5 Drawing Sheets

(56) References Cited

U.S. PATENT DOCUMENTS

| | | |
|---|---|---|
| 8,397,840 B2 * | 3/2013 | Downie et al. ............. 175/325.5 |
| 2003/0075340 A1 * | 4/2003 | Tran et al. .................... 166/384 |
| 2010/0044110 A1 * | 2/2010 | Bangru et al. ................. 175/61 |
| 2010/0276159 A1 | 11/2010 | Mailand et al. |
| 2011/0088891 A1 | 4/2011 | Stout |
| 2012/0125637 A1 | 5/2012 | Chenault et al. |
| 2013/0000990 A1 | 1/2013 | Downie et al. |

OTHER PUBLICATIONS

Quorom Technilogies, "Sputter Coating Technical Brief," Document No. TB-SPUTTER, Issue 2, Jan. 2002.

Deloro Stellite, "Stellite(r) 3 Alloy," Technical Data, copyright 2008.

Gould, J., "Application of Electro-Spark Deposition as a Joining Technology," Welding Journal, vol. 90, pp. 191-197, Oct. 2011.

First Office Action in co-pending U.S. Appl. No. 13/762,207, mailed Apr. 24, 2015.

* cited by examiner

HARD SURFACING NON-METALLIC SLIP COMPONENTS FOR DOWNHOLE TOOLS

CROSS-REFERENCE TO RELATED APPLICATIONS

This application is filed concurrently with U.S. application Ser. No. 13/762,207, entitled "Hard Surfacing Metallic Slip Components for Downhole Tools," which is incorporated herein by reference in its entirety.

BACKGROUND OF THE DISCLOSURE

Downhole tools use slips to engage a casing and hold a downhole tool in place. For example, packers are a type of downhole tool that uses slips. Packers are used in oil and gas wells primarily to isolate different production zones. On the packer, a slip provides a frictional hold between the packer and casing or wellbore that helps keep the packer in place when subjected to high pressure, high temperature, and applied forces. The packer and associated slip is either permanent or retrievable.

Permanent packers are usually less expensive to manufacture and are typically capable of withstanding high pressure and temperature. In contrast, a retrievable packer can be "unset" by using hydraulic or mechanical means. After the packer is "unset," it can be brought uphole with tubing or a work string. Because it is designed to be reusable, a retrievable packer is, typically, more complex and has more mechanical parts.

Because it is permanent, a permanent packer is typically destroyed by milling or drilling to remove it. In other words, the permanent packer is designed for a single use and is destroyed to remove it. Thus, it is desirable to construct a permanent packer from materials that are more readily milled or drilled. Examples of materials that are more readily milled or drilled are made from non-metallic materials, such as composites, ceramics and plastics. Plastics such as ultra-high-molecular-weight polyethylene (UHMW), polytetrafluoroethylene (PTFE) or similar engineering grade plastics can be used because of their high molecular weight and long molecular chains, although other thermoplastic polyethylenes might also be used.

Broadly speaking, more readily milled/drilled materials are weaker and are therefore less capable of carrying a load. Correspondingly, forming a permanent packer from more sturdy metallic materials makes the permanent packer stronger. However, the added strength means that it is more difficult to mill or drill the permanent packer to remove it. Added strength to the packer means that additional rig time is required to mill or drill the packer to remove it. Thus, there is an inherent contradiction between using permanent packers composed of metallic materials because it is significantly more time consuming to mill or drill when they are no longer needed. Because rig time is expensive, the added expense of additional rig time can equal or exceed the savings of using a permanent packer as opposed to a retrievable packer.

The use of more durable metallic materials can also cause a problem known as "bit tracking" to occur when a drilling or milling a metallic material. During bit tracking, the drill bit used to mill out the tool stays on one path and no longer cuts the material to be drilled or milled. When this happens, it is appropriate to pick up the bit and rapidly recontact the material being drilled. During bit tracking, some material may be removed, but in actuality the drill bit is merely wearing against the surface of the downhole tool. Essentially, during bit tracking, the drill bit is rotating, but it is not appropriately cutting the packer or other material to be removed. Unfortunately, it might not be readily apparent to operators at the surface that bit tracking is occurring because the drill bit continues to rotate normally, even though it is not drilling or milling the packer or other material to be drilled.

A downhole tool may be used when it is desirable to seal tubing or other pipe in the casing or wellbore of the well, such as when it is desired to pump cement or other slurry out into a formation. In this situation, it is appropriate to seal the tubing with respect to the well casing and to prevent the fluid pressure of the slurry from lifting the tubing out of the well. Packers, bridge plugs, and the like are designed for these general purposes. Slip mechanisms are devices used on these downhole tools to contact the wellbore and hold the downhole tool in the wellbore without substantial movement, and as discussed above, to hold back fluid or pressure. Typically, the slip mechanism is used to contact the wellbore to hold the downhole tool in the wellbore without substantial movement.

Current slip mechanisms used in the art include T-style, hydro-style, and arrow-style slip mechanisms, which are briefly discussed.

Figure 1A:
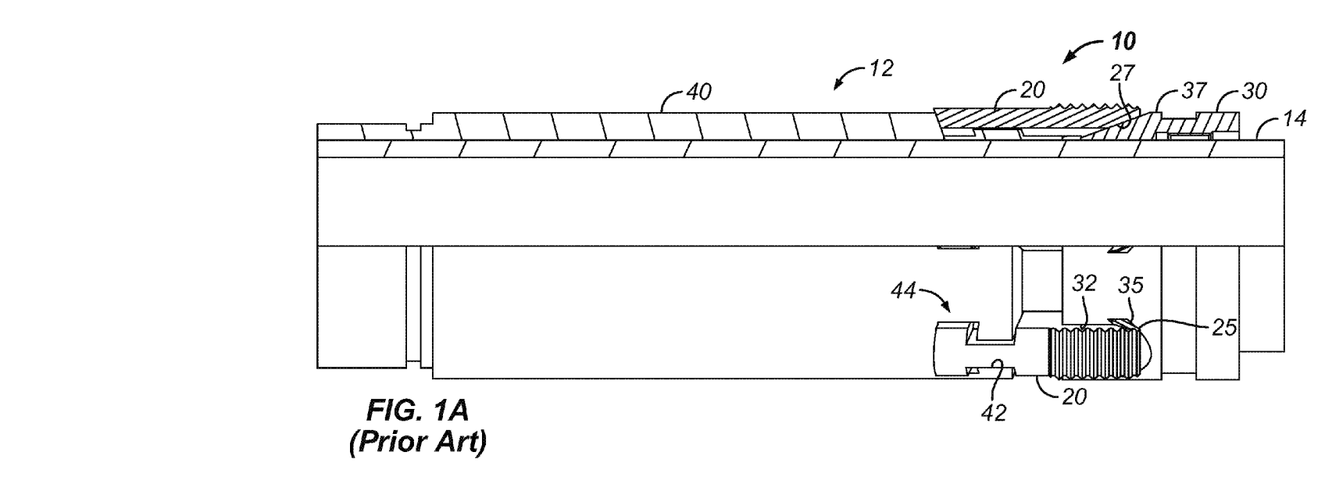
FIG. 1A illustrates a partial cross-section of a downhole tool having a T-style slip mechanism according to the prior art.
Figure 1B:
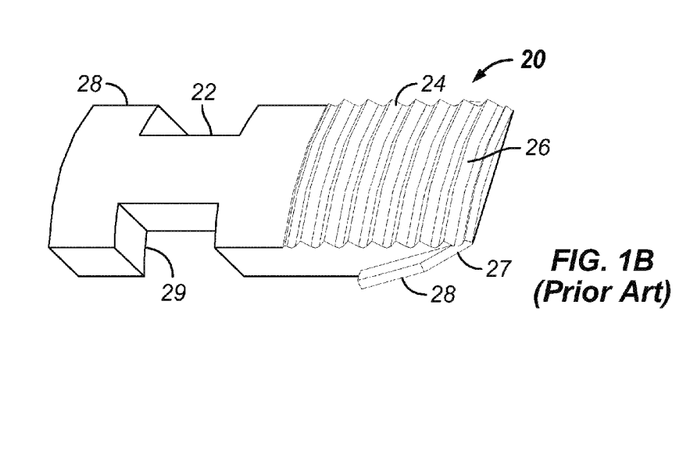
FIG. 1B illustrates a perspective view of the T-style slip of FIG. 1A.

FIGS. 1A-1B show a T-style slip mechanism 10 according to the prior art. The mechanism 10 includes several slip components, such as T-style slips 20, a cone 30, and a cage 40—each of which dispose on a mandrel 14 of a packer 12 or the like. The T-style slips 20 have wickered ends 24 and T-shaped ends 28 interconnected by necks 22. Slip slots 42 in the cage 40 hold the T-shaped ends 28, while slots 32 in the cone 30 hold the wickered ends 24. In particular, the wickered ends 24 have shoulders or ledges 25 (FIG. 1A) that ride in grooves 35 in the cage's slots 32.

The T-style slips 20 set into the casing wall when the cone 30 is mechanically or hydraulically moved closer to the slip cage 40. For this reason, the slips' wickered ends 24 have ramped edges 27 that are pushed by the cone 30.

Figure 2A:
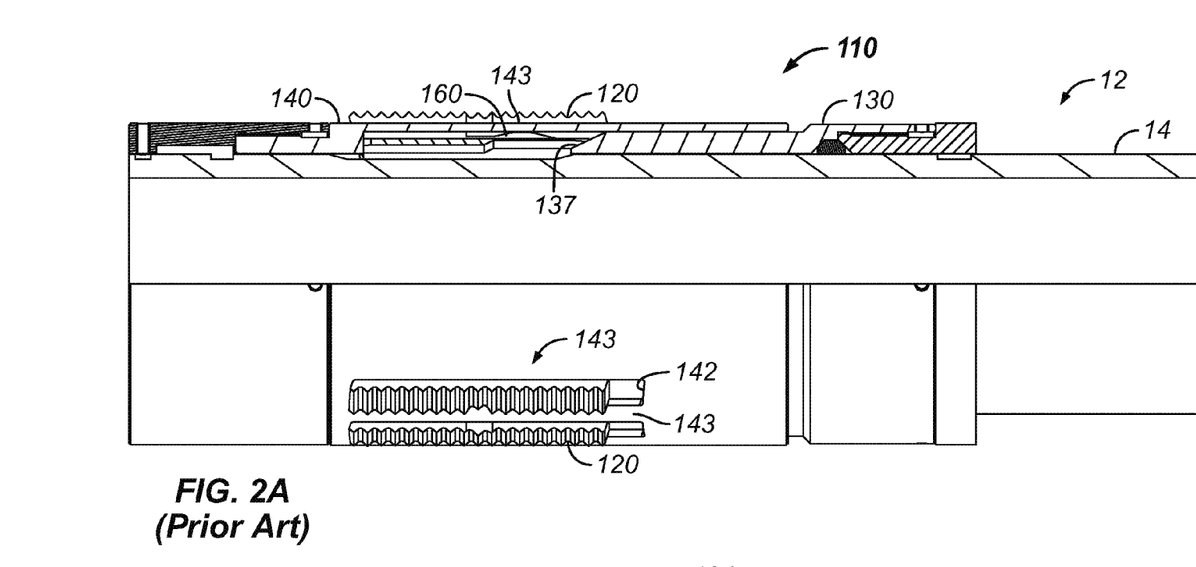
FIG. 2A illustrates a partial cross-section of a downhole tool having a hydro-style slip mechanism according to the prior art.
Figure 2B:
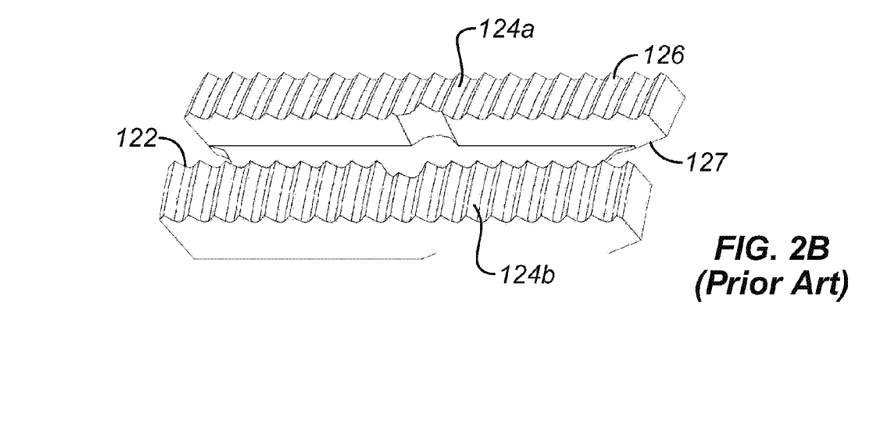
FIG. 2B illustrates a perspective view of the hydro-style slip of FIG. 2A.

FIGS. 2A-2B show a hydro-style slip mechanism 110 according to the prior art. The mechanism 110 includes several slip components, such as hydro-style slips 120, a cone 130, and a cage 140—each of which dispose on a mandrel 14 of a packer 12 or the like. The hydro-style slips 120 fit around the mandrel 14 and have wickered faces 124a-b that fit through slip slots 142 in the cage 140. A spring 160 disposes in a central passage 122 along the length of the slip 120 and sits beneath a central band 144 in the slip slots 142. This spring, which is usually a leaf style spring, biases the slip 120 to a retracted condition when the cone 130 has been pulled out of the set position. As shown in the set position, however, the hydro-style slip 120 has wickers 126 on its outer face that can set into the surrounding casing wall (not shown).

To set the hydro-style slip 120 into the casing wall, the cone 130 is moved (typically by hydraulic activation) further beneath the slip cage 140 and also beneath the hydro-style slips 120. A ramped edge 137 on the cone 130 pushes against the ramped end 127 of the slip 120. Therefore, the cone 130 should slide beneath the slip cage 140 to push the slips 120 through the slip slots 142.

Figures 3A, 3B:
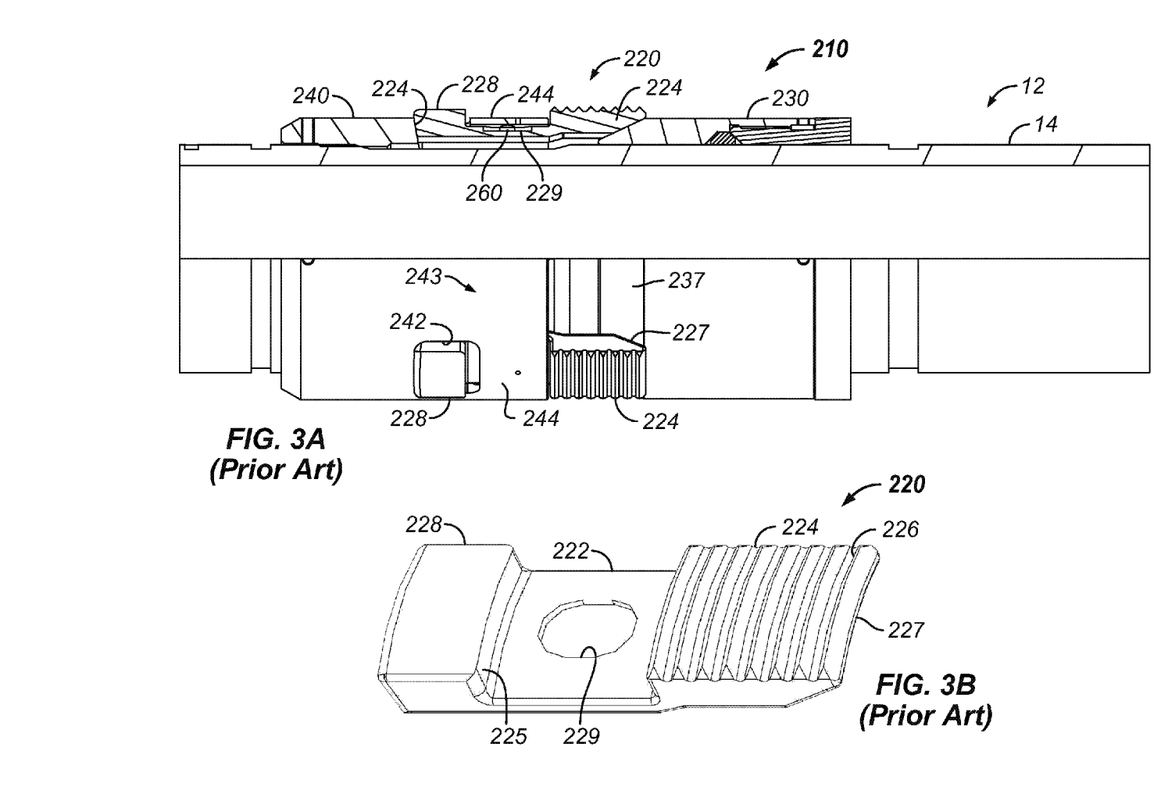
FIG. 3A illustrates a partial cross-section of a downhole tool having an arrow-style slip mechanism according to the prior art.
FIG. 3B illustrates a perspective view of an arrow style slip of FIG. 3A.

FIGS. 3A-3B show an arrow-style slip mechanism 210 according to the prior art. This mechanism 210 includes several slip components, such as arrow-style slips 220, a cone 230, and a cage 240—each of which dispose on the mandrel 14 of a packer 12 or the like. The arrow-style slips 220 fit around the mandrel 14 and have wickered ends 224 and fitted ends 228 interconnected by necks 222. The fitted ends 228 fit in comparably shaped slots 242 in the cage 240, while the necks 222 fit under a shoulder area 244 on the edge of the cage 240. The arrow-style slip 220 sets into the casing wall when the cone 230 is mechanically or hydraulically moved closer to the slip cage 240. In particular, the wickered end 224 of the slip 220 includes a ramped edge 227 on its inner side. When the cone 230 is moved toward the cage 240, the cones ramped edge 237 engages the slip's ramped ends 227, pushing the slip's wickered end 224 into the casing wall. When the slip 220 sets, the wickers 226 on the slip's wickered end 224 set into the surrounding casing wall (not shown). Whether the slips 220 are set or not, the cage 240 remains connected to the fitted ends 228 of the arrow-style slip 222 by virtue of these slip slots 242.

The requirements for slips are that they bite or lock in a tool; the prime example being a packer slip used to lock the packer in a selected position in casing or wellbore. The problem is to make the slips easier to remove by milling or drilling techniques thereby cutting well construction, completion time, and costs.

The prior art slips have been made from gray and ductile types of cast irons. These cast irons are more readily millable/drillable, but still require significant milling/drilling time. More recently, slips have been made with ceramic biting elements glued in composite slip bases. The work in composite slips is promising but unproven because there may be ductility issues with the composite slip base materials. Thus, these solutions, at this point, have provided less than an ideal solution.

In addition, it is known to harden the surface of an aluminum metallic packer by anodizing the surface to form an anodized metallic coating. However, this is problematic because anodization has been found to produce very thin coatings of only a few angstroms or microns. Because this is a relatively thin layer, the slip cannot readily adhere with the substrate. Ion sputtering has also been used to form a metallic coating. However, this also produces only a thin substrate on the order of a few angstroms or microns, which has also been found to lack sufficient strength.

The subject matter of the present disclosure is directed to overcoming, or at least reducing the effects of, one or more of the problems set forth above.

SUMMARY OF THE DISCLOSURE

A slip component for a downhole tool has a bearing surface that is hard surface treated. The slip component can be a slip or other component of a slip mechanism used on a packer, bridge plug, or other downhole tool. In fact, the slip component can be a slip, a cone, and/or a cage of a slip mechanism of the downhole tool and can even include a portion of a mandrel of the downhole tool adjacent the slip mechanism. Either way, the slip component is composed of a non-metallic base material, such as plastic, composite, and ceramic.

To hard surface treat the slip component, at least the bearing surface of the slip component is positioned relative to an ion sputtering apparatus, which has an ion gun and a target material. The bearing surface can be a gripping surface of a slip used to engage a downhole tubular, although any bearing surface subject to wear, friction, etc. can benefit from the disclosed techniques. Using the ion sputtering apparatus, an intermediate layer is bonded onto at least the bearing surface of the slip component by ion sputtering an intermediate material onto the non-metallic base material. The intermediate material can be nickel, iron, cobalt, gold, silver, an alloy or a combination thereof.

After bonding the intermediate layer, at least the bearing surface is positioned relative to an electrospark deposition apparatus, which has an electrode composed of a selected external material for depositing on the slip component. Using the electrospark deposition apparatus, an external layer is bonded at least on the intermediate layer by electrospark depositing the external material of the electrode to the metallic material of the intermediate layer.

During the electrospark deposition of the external material to the base material, a metallurgical bond is formed between the external material with the metallic base material in which a bulk temperature of the slip component is maintained well below the melting point of the base material. In this way, the bulk temperature of the slip component can be maintained below a temperature where its structure is compromised. For example, a composite slip segment utilizing a thermoset resin could be damaged if bulk temperatures exceeded about 250° C. for any significant length of time.

Various external materials can be used for electrosparking, including, but not limited to, a metallic material, a cermet material, a ceramic material, a hard surfacing alloy, a cobalt-based hard surfacing alloy, an iron-based hard surfacing alloy, a nickel-based hard surfacing alloy, a stainless steel, a nickel super alloy, and a cobalt base alloy, such as a Stellite® metal alloy. (STELLITE is a registered trademark of DELORO STELLITE HOLDINGS CORPORATION). As some particular examples, the hard surfacing alloy can be UNS R30001, UNS R30035, and UNS N99646 available from Stellite Coatings of Goshen, Ind.

A hardness of at least a portion of the external layer can be increased further by surface treating the external layer to induce compressive stresses or relieve tensile stresses. For example, surface treating the external layer can involve using a mechanical process, such as peening, shot peening, and burnishing, or can involve using a non-mechanical process, such as ultrasonic peening and laser peening.

The foregoing summary is not intended to summarize each potential embodiment or every aspect of the present disclosure.

DETAILED DESCRIPTION OF THE DISCLOSURE

Figure 4:
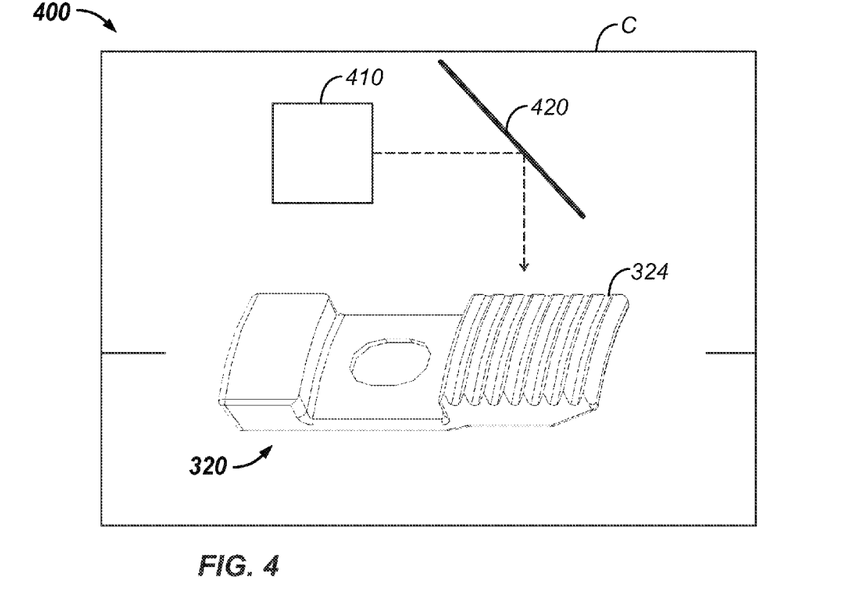
FIG. 4 illustrates a schematic representation of an ion sputtering system surface treating a slip component according to the present disclosure.

FIG. 4 illustrates a schematic representation of an ion sputtering system 400 according to the present disclosure. Ion sputtering system 400 includes a chamber C, an ion gun 410, and a target 420 for applying an intermediate layer in a hard surface treatment process to a workpiece 320, which is a non-metallic slip component for a downhole tool. In this example, the workpiece 320 is a non-metallic slip component, e.g., a component of a slip mechanism used on a downhole tool, such as a packer, bridge plug, or the like, and more particularly, the workpiece 320 is a slip, such as an arrow-style slip, for a slip mechanism. Although the present examples focus on hard surface treatment of a slip, it will be appreciated with the benefit of the present disclosure that the disclosed hard surface treatment process of the present disclosure can be applied to any slip component (or any component) of a downhole tool having a bearing surface that can benefit from hard surface treatment.

Vacuum sputtering accomplished by the ion sputtering system 400 is a well-established method of depositing a thin layer of bond material upon a substrate. According to the technique, a beam of ions is fired from the ion gun 410 at the target 420 in the chamber C. Preferably, the chamber C is maintained at substantially a vacuum. The resulting impact of the ions against the target 420 causes atoms of the target material to be ejected therefrom and to be deposited onto the surface 324 of the slip 320. Examples materials for the target 420 include nickel, iron, gold and silver and alloys or combinations of these materials.

Figure 5A:
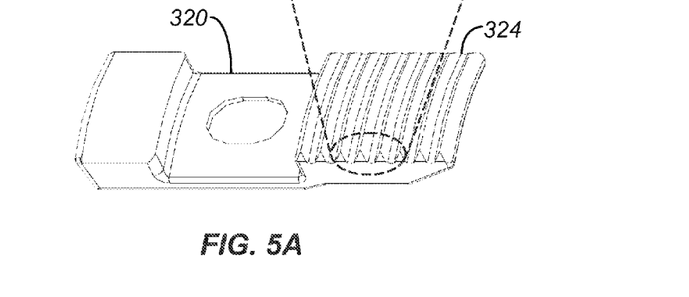
FIG. 5A illustrates a slip component after an ion sputtering system, such as illustrated in FIG. 4, has deposited an intermediate layer using ion sputtering to at least a bearing surface of the component.
Figure 5B:
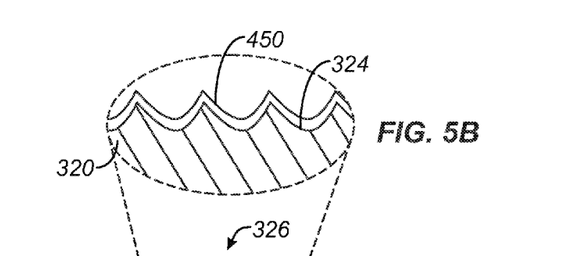
FIG. 5B illustrates a detailed view of the slip component of FIG. 5A.

FIGS. 5A-5B illustrate the non-metallic slip 320 after the ion sputtering system 400 of FIG. 4 has deposited an intermediate layer 450 using ion sputtering to the surface 324 of the slip 320. The ion sputtered metallic layer 450 can have a thickness on the order of five thousand to ten thousand angstroms. Ion sputtering is the preferred process for applying the metallic layer 450 because of the low heat input the ion sputtering process has on the base material and the ability to adhere the layer to the substrate, which in this case is the non-metallic gripping section 326 of the slip 320. A process with a high heat input could damage the underlying material of the non-metallic gripping section 326 because the heat input may melt the underlying material. However, processes other than ion sputtering could be used if they have sufficiently low heat input so as not to melt or damage and be able to adhere to the underlying material of the non-metallic slip 320.

For its part, it is believed that the ion sputtering process should not raise the temperature of the underlying base material above a temperature where its structure is compromised. The actual temperature at which the structure of the base material is compromised depends on the particular base material involved, the time period in which the base material is exposed, and other factors. In a general sense, the compromising temperature may be the base material's solidus temperature, melting point temperature, or other temperature at which physical properties (e.g., hardness, molecular makeup, crystal structure, mechanical bonds, matrix, etc.) of the base materials is detrimentally altered. As one example, a composite slip segment utilizing a thermoset resin as the base material could be damaged if bulk temperatures exceed about 250° C. for any significant length of time.

Figure 6:
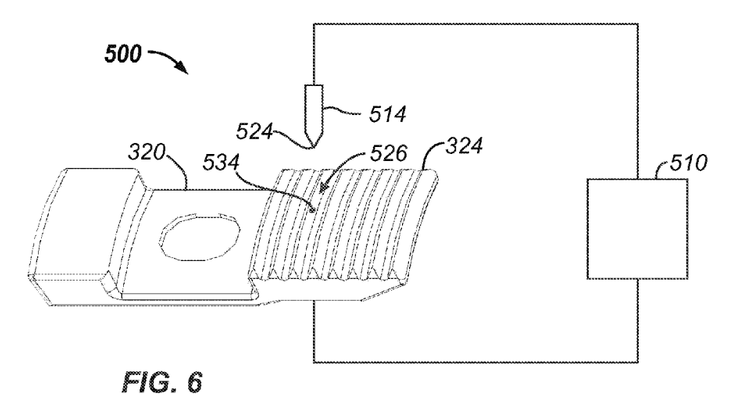
FIG. 6 is illustrates a schematic representation of an electrospark deposition system to surface treat the slip component according to the present disclosure.

After treatment with the ion sputtering process to apply the intermediate layer 450, the slip 320 can then be treated with the electrospark process disclosed previously with reference to FIG. 4 to apply an external, electrosparked layer. In particular, FIG. 6 illustrates a schematic of an electrospark deposition system 500 for hard surface treating the non-metallic slip component 320 according to the present disclosure. Electrospark deposition is also referred to as spark hardening, electrospark toughening, electrospark alloying, pulse fusion surfacing and pulsed electrode surfacing. Broadly speaking, electrospark deposition is a pulsed micro-welding process that uses rapid electrical power discharges to accomplish metal transfer from an electrode to a contacting surface. Other "impulse" technologies, such as percussion welding and magnetic pulse welding also transfer minute quantities of material using "pulsing" to accomplish metal transfer.

The electrospark deposition system 500 includes a control unit 510 that connects to the non-metallic slip 320 and to an electrode 514, which can be positioned and moved with respect to the slip 320. The parameters associated with the electrode 514 and power from the control unit 510 are controlled such that controlled electrostatic forces are established in the electrode's tip 524 and in the slip 320 and specifically at a location 526 where it is desired to deposit material by the electrospark process.

More specifically, the electrode 514 is positioned with respect to the slip 320 such that the electrostatic force is substantially equal to a glow discharge condition. The electrode 514 is then advanced into contact with the surface of the slip 320 and then quickly withdrawn to draw a spark arc between the slip 320 and the electrode 514. It is preferred that the process is controlled such that no significant current flows between electrode 514 and workpiece 512. In this manner, the only significant heating of the slip 320 is caused by the spark arc itself. This heating will occur substantially only in the area where the electrode 514 has touched the slip 320, and air quenching at this point will quickly occur, as taught in U.S. Pat. No. 4,551,603.

During the electrospark process, the parameters are also controlled such that the spark arc has sufficient energy to melt a portion of the electrode 514. The electrode's tip 524 is the anode and preferably has a very small area so that the arc spark can melt the tip 524 of the electrode 514 without significantly heating of the slip 320. As the electrode 514 is withdrawn from the slip 320, a deposit of electrode material 534 is left on the slip's surface 324. This process is repeated until the desired areas of the slip 320 have had electrode material 534 deposited thereon. These deposits may be thought of as the transfer of minute quantities of a desired surfacing material from a contacting electrode 414 to the surface 324 of the slip 320. Ultimately, these microwelds will overlap, yielding a complete, new hardened surface that is bonded to the underlying material of the slip 320.

Figure 7:
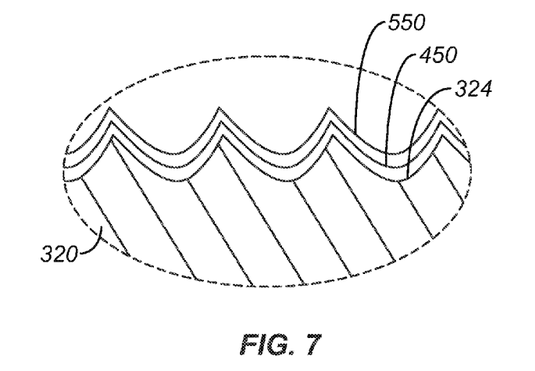
FIG. 7 illustrates a detailed view of the slip component after the electrospark deposition system of FIG. 6 has deposited a hard external layer using electrosparking to the intermediate layer deposited using ion sputtering.

FIG. 7 shows an example of the slip component 320 of FIG. 5B after the electrospark deposition system 500 has deposited a metallic external layer 550 using electrosparking to the metallic substrate layer 450 deposited using ion sputtering. As noted above, electro spark deposition involves the transfer of minute molten droplets of the desired surfacing material, such as a metal, from the contacting electrode (514) to the surface 324 of the slip 320. These micro-welds overlap, yielding a complete new surface. In addition, because the electrosparked material is bonded to the metallic substrate of the slip's surface 324, a metallurgical bond is formed with the ion sputtered surfacing. This is in contrast to other low heat input processes, such as arc-spraying or high velocity oxy-fuel processes.

As noted above, a deposit of the electrode's material is left on the slip's surface 324 to form the electrosparked layer 550. The electrode deposit material can include a metallic material, a cermet material, or a ceramic material, and can include metal carbides, nitrides, or borides. One preferred example is cemented tungsten carbide, which includes a metal carbide and a matrix ductile metal. Alternatively, a hard surfacing alloy, such as a cobalt, iron, or nickel-based hard surfacing alloy, may also be used. Specific examples of these alloys include UNS R30001, UNS R30035 or UNS N99646. In additional alternatives, nickel alloys, such as Ni-super alloys; stainless steel compositions, such as martensitic stainless steels; or cobalt base alloy (e.g., Stellite®) may be used.

In additional embodiments to improve hardness of the electrosparked layer 550, the material properties of the electrosparked layer 550 can be further improved by mechanical working, such as peening, shot peening, and burnishing. Non-mechanical processes can also be used, such as ultrasonic peening and laser peening. The further working can increase the hardness of at least a portion of the layer of the electrosparked material by inducing compressive stresses or relieving tensile stresses.

As noted above, the electrospark process has an extremely low heat input. It is believed that the process results in a maximum temperature rise on the order of a few degrees C away from the joining interface of the electrode 514 and the slip's surface 324. This low heat input process, therefore, does not alter the integrity of the non-metallic slip 320, but results in a metallurgical bond between the hard exterior surface and the intervening ion sputtered substrate bond material layer. It is believed that the disclosed process results in a hardened zone that is not limited to a low bond strength, such as 12000 psi and less.

Figure 8:
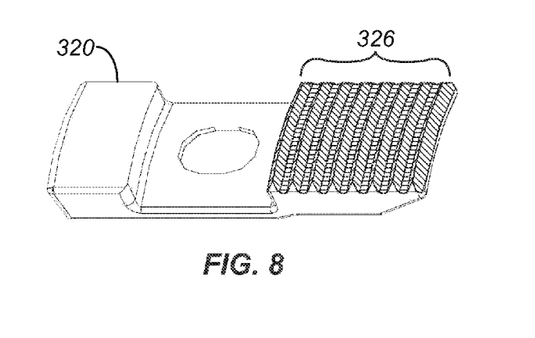
FIG. 8 illustrates the slip component having the surface treatment applied to the gripping or bearing surface.

As noted herein, various portions of a slip component can be hard surface treated according to the techniques disclosed herein. FIG. 8 illustrates a slip 320, such as an arrow-style slip, wherein the disclosed process has been applied to the biting edges or surfaces 326, also referred to as gripping surfaces of the slip 320. Other bearing surfaces of the slip 320 may benefit from the disclosed hard surface treatment of the present disclosure. For example, the ramp 327 on the end of the slip 320 can be treated according to the present disclosure. Accordingly, one skilled in the art will appreciate that the hard exterior layer primarily metallurgically bonded to the intermediate layer below can provide improved wear resistance, erosion resistance, and also resistance to cutting and deformation so that any bearing surface of the slip component can benefit from the disclosed treatment.

As also noted above, the disclosed process can also be used to harden various types of slips, such as T-slips, hydro-style slips, or arrow style slips. Indeed, the disclosed process can also be used to harden any bearing surface of a slip component or even a downhole tool, such as a packer, made at least in part from a non-metallic material. For example, the disclosed process can be used for cones, gauge rings, mandrel, or similar components of a downhole tool.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A method of hard surfacing a slip component for a downhole tool, the slip component having a bearing surface and being composed of a base material, the base material being non-metallic, the method comprising:
   positioning at least the bearing surface of the slip component for hard surface treatment;
   bonding an intermediate layer onto at least the bearing surface by ion sputtering an intermediate material onto the non-metallic base material; and
   bonding an external layer at least on the intermediate layer by electrospark depositing an external material to at least the intermediate material of the intermediate layer.

2. The method of claim 1, wherein positioning at least the bearing surface of the slip component for the hard surface treatment comprises positioning at least the bearing surface relative to an ion sputtering apparatus.

3. The method of claim 2, wherein positioning at least the bearing surface of the slip component for the hard surface treatment further comprises positioning at least the bearing surface relative to an electrospark deposition apparatus.

4. The method of claim 1, wherein electrospark depositing the external material to the base material comprises forming a metallurgical bond between the external material with the intermediate material.

5. The method of claim 1, wherein electrospark depositing the external material to at least the intermediate material comprises maintaining a bulk temperature of the slip component below a temperature that compromises the structure of the non-metallic base material.

6. The method of claim 1, wherein ion sputtering the intermediate material onto the bearing surface comprises maintaining a bulk temperature of the slip component below a temperature that compromises the structure of the non-metallic base material.

7. The method of claim 1, wherein the base material of the slip component is selected from the group consisting of a plastic, an engineering grade plastic, a composite, and a ceramic.

8. The method of claim 1, wherein intermediate material comprises nickel, iron, cobalt, gold, silver, an alloy thereof, or a combination thereof.

9. The method of claim 1, wherein the external material is selected from the group consisting of a carbide, a nitride, a boride, a cemented tungsten carbide, a hard surfacing alloy, a cobalt-based hard surfacing alloy, an iron-based hard surfacing alloy, a nickel-based hard surfacing alloy, a stainless steel, a nickel super alloy, and a cobalt base alloy.

10. The method of claim 9, wherein the cobalt base alloy is selected from the group consisting of UNS R30001, UNS R30035 and UNS N99646.

11. The method of claim 1, further comprising increasing hardness of at least a portion of the external layer of the external material by surface treating the external layer to induce compressive stresses or relieve tensile stresses.

12. The method of claim 11, wherein surface treating the external layer comprises:
   using a mechanical process selected from the group consisting of peening, shot peening, and burnishing; or
   using a non-mechanical process selected from the group consisting of ultrasonic peening and laser peening.

13. The method of claim 1, wherein the slip component comprise at least one slip of a slip mechanism of the downhole tool, and wherein the bearing surface comprises a gripping surface of the at least one slip.

14. The method of claim 1, wherein the slip component is selected from the group consisting of a slip, a cone, and a cage of a slip mechanism of the downhole tool.

15. The method of claim 1, wherein the slip component comprises at least a portion of a mandrel of the downhole tool adjacent a slip mechanism of the downhole tool.

16. A slip component for a downhole tool, the slip component being composed of a base material and having a bearing surface, the base material being non-metallic, having a solidus temperature, and having a melting point, at least the bearing surface treated by:
- positioning at least the bearing surface of the slip component for hard surface treatment;
- bonding an intermediate layer onto at least the bearing surface by ion sputtering an intermediate material onto the non-metallic base material; and
- bonding an external layer at least on the intermediate layer by electrospark depositing an external material to at least the intermediate material of the intermediate layer.

* * * * *